(12) United States Patent
Jang

(10) Patent No.: US 8,971,142 B2
(45) Date of Patent: Mar. 3, 2015

(54) SEMICONDUCTOR MEMORY DEVICE AND METHOD OF OPERATING THE SAME

(71) Applicant: SK Hynix Inc., Gyeonggi-do (KR)

(72) Inventor: Woong-Ju Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/714,358

(22) Filed: Dec. 13, 2012

(65) Prior Publication Data

US 2014/0064005 A1 Mar. 6, 2014

(30) Foreign Application Priority Data

Aug. 29, 2012 (KR) ........................ 10-2012-0095043

(51) Int. Cl.
| | |
|---|---|
| G11C 7/02 | (2006.01) |
| G11C 5/14 | (2006.01) |
| G11C 7/08 | (2006.01) |
| G11C 7/06 | (2006.01) |
| G11C 11/4091 | (2006.01) |
| G11C 11/4094 | (2006.01) |

(52) U.S. Cl.
CPC .. *G11C 7/08* (2013.01); *G11C 7/02* (2013.01); *G11C 7/065* (2013.01); *G11C 11/4091* (2013.01); *G11C 11/4094* (2013.01)
USPC ................. 365/208; 365/189.09; 365/189.11; 365/205

(58) Field of Classification Search
USPC ......................................... 365/208
See application file for complete search history.

(56) References Cited

U.S. PATENT DOCUMENTS

| | | | | |
|---|---|---|---|---|
| 5,870,344 | A  * | 2/1999 | Ozawa ........................ | 365/205 |
| 6,154,405 | A  * | 11/2000 | Takemae et al. ......... | 365/185.24 |
| 6,188,624 | B1 * | 2/2001 | Zheng ........................ | 365/207 |
| 6,449,202 | B1 * | 9/2002 | Akatsu et al. ............. | 365/205 |
| 6,529,434 | B2 * | 3/2003 | Kitamoto et al. ......... | 365/222 |
| 7,813,156 | B2 * | 10/2010 | Mizuno et al. ............ | 365/63 |
| 2013/0155784 | A1 * | 6/2013 | Lim et al. ................. | 365/189.05 |

FOREIGN PATENT DOCUMENTS

KR 1020110054773 5/2011

OTHER PUBLICATIONS

Satoru Akiyama et al., "Low-Vt Small-Offset Gated Preamplifier for Sub-1V Gigabit DRAM Arrays," IEEE International Solid-State Circuits Conference, Feb. 10, 2009, pp. 142-144.

* cited by examiner

*Primary Examiner* — Son Mai
(74) *Attorney, Agent, or Firm* — IP & T Group LLP

(57) ABSTRACT

A semiconductor memory device includes a bit line pre-sense amplifier configured to sense a potential difference between bit line pair and amplify the voltages of the bit line pair based on the sensed potential difference, a bit line main sense amplifier configured to sense a potential difference between the bit line pair and amplify the voltages of the bit line pair to first and second driving voltages based on the sensed potential difference, and a power supplying controller configured to supply the second driving voltage to the bit line pre-sense amplifier and the bit line main sense amplifier.

14 Claims, 4 Drawing Sheets

US 8,971,142 B2

SEMICONDUCTOR MEMORY DEVICE AND METHOD OF OPERATING THE SAME

CROSS-REFERENCE TO RELATED APPLICATIONS

The present application claims priority of Korean Patent Application No. 10-2012-0095043, filed on Aug. 29, 2012, which is incorporated herein by reference in its entirety.

BACKGROUND

1. Field

Exemplary embodiments of the present invention relate to semiconductor design technology, and more particularly, to a semiconductor memory device including a bit line pre-sense amplifier and a bit line main sense amplifier.

2. Description of the Related Art

In general, a semiconductor memory device, such as double data rate synchronous DRAM (DDR SDRAM), performs a read operation and a write operation in response to several external signals. The write operation means an operation for storing data in a memory cell corresponding to an address, and the read operation means an operation for outputting data stored in a memory cell, corresponding to an address. The semiconductor memory device may include a variety of circuits for performing the read operation and the write operation.

FIG. 1 is a circuit diagram illustrating a conventional semiconductor memory device.

Referring to FIG. 1, the semiconductor memory device includes a memory cell 110, a bit line pre-sense amplifier 120, a bit line main sense amplifier 130, and a bit line equalizer 140.

The memory cell 110 stores data and includes a cell transistor CT and a cell capacitor CC.

The bit line pre-sense amplifier 120 senses a potential difference between bit lines BL and BLB for a specific section in response to an active operation and amplifies the voltages of the bit lines BL and BLB based on the sensed potential difference. The bit line pre-sense amplifier 120 includes first and second NMOS transistors NM1 and NM2 connected to the bit lines BL and BLB, respectively, and third and fourth NMOS transistors NM3 and NM4 controlled in response to a gate control signal SG for a specific section when an active operation is performed. For reference, the bit line pre-sense amplifier 120 is often referred to as a low-Vt gated amplifier.

The bit line main sense amplifier 130 senses a potential difference between the bit lines BL and BLB and amplifies the voltages of the bit lines BL and BLB to a voltages of a pull-up driving power line RTO and a pull-down driving power line SB based on the sensed potential difference. The bit line main sense amplifier 130 includes first and second PMOS transistors PM1 and PM2 for driving the bit lines BL and BLB to the voltage of the pull-up driving power line RTO and fifth and sixth NMOS transistors NM5 and NM6 for driving the bit lines BL and BLB to the voltage of the pull-down driving power line SB.

The bit line equalizer 140 equalizes the voltages of the bit lines BL and BLB to a precharging voltage VBLP in a precharging operation section. The bit line equalizer 140 includes seventh to ninth NMOS transistors NM7, NM8, and NM9 controlled in response to a bit line equalization signal BLEQ. Here, the precharging voltage VBLP has a level half the core voltage VCORE, that is, a voltage level corresponding to data '1'.

The semiconductor memory device stores or outputs data by performing a write operation or a read operation after an active operation and then performs a precharging operation for a next active operation. The active operation and the precharging operation of the semiconductor memory device are described below.

First, when a word line WL is activated during an active operation, the cell transistor CT is turned on, and thus data stored in the cell capacitor CC is transferred to the primary bit line BL. Next, the bit line pre-sense amplifier 120 and the bit line main sense amplifier 130 amplify the primary bit line BL and the secondary bit line BLB to a core voltage VCORE, that is, the voltage of the pull-up driving power line RTO, and a ground voltage VSS, that is, the voltage of the pull-down driving power line SB by performing the respective sense amplification operation.

Next, when a precharging operation is performed, the bit line equalization signal BLEQ becomes a logic low level. In response, the seventh to ninth NMOS transistors NM7, NM8, and NM9 of the bit line equalizer 140 are turned on. Accordingly, the primary bit line BL and the secondary bit line BLB are driven to the precharging voltage VBLP, which is called the precharging operation of the bit lines BL and BLB.

The semiconductor memory device has the following concerns when an active operation and a precharging operation are performed.

First, during the active operation, the bit line pre-sense amplifier 120 and the bit line main sense amplifier 130 perform amplification operations using the ground voltage VSS as illustrated in the drawing and the above description. The ground voltage VSS is commonly vulnerable to noise and become even more vulnerable to noise when an amplification operation is performed. Accordingly, the bit line pre-sense amplifier 120 and the bit line main sense amplifier 130 that perform the amplification operations using the ground voltage VSS are very vulnerable to noise, which results in malfunction.

Next, when the precharging operation, the primary bit line BL and the secondary bit line BLB are precharged to the precharging voltage VBLP that has a level half the core voltage. In this state, if the gate control signal SG is affected by malfunction, the electrons of the bit lines BL and BLB precharged to the precharging voltage VBLP flow through the third and the fourth NMOS transistors NM3 and NM4. Next, the electrons flow into a terminal for the ground voltage VSS through the first and the second NMOS transistors NM1 and NM2. In other words, when the precharging operation is performed, an unnecessary current path may form in the first to fourth NMOS transistors NM1, NM2, NM3, and NM4, and current consumption through the leakage current path is unnecessarily generated.

SUMMARY

Exemplary embodiments of the present invention are directed to provide a semiconductor memory device capable of controlling a power source supplied to the bit line pre-sense amplifier and the bit line main sense amplifier in an active operation section and a precharging operation section.

In accordance with an embodiment of the present invention, a semiconductor memory device includes a bit line pre-sense amplifier configured to sense a potential difference between bit line pair and amplify the voltages of the bit line pair based on the sensed potential difference, a bit line main sense amplifier configured to sense a potential difference between the bit line pair and amplify the voltages of the bit line pair to first and second driving voltages based on the sensed potential difference, and a power supplying controller configured to supply the second driving voltage to the bit line pre-sense amplifier and the bit line main sense amplifier.

In accordance with another embodiment of the present invention, a semiconductor memory device includes a bit line pre-sense amplifier configured to sense a potential difference between bit line pair and amplify voltages of the bit line pair based on the sensed potential difference, a bit line main sense amplifier configured to sense a potential difference between the bit line pair and amplify voltages of the bit line pair to first and second driving voltages based on the sensed potential difference, a power line driving unit configured to generate the first and the second driving voltages in response to first and second driving control signals, and a power source transfer transistor configured to transfer the second driving voltage to the bit line main sense amplifier after the second driving voltage is supplied to the bit line pre-sense amplifier.

In accordance with yet another embodiment of the present invention, a method of operating a semiconductor memory device including a bit line pre-sense amplifier and a bit line main sense amplifier includes primarily sensing a potential difference between bit line pair and amplifying the voltages of the bit line pair by supplying a power source to the bit line pre-sense amplifier when an active operation is performed; secondarily sensing a potential difference between the bit line pair and amplifying the voltages of the bit line pair by supplying a power source to the bit line pre-sense amplifier, after the primarily sensing of a potential difference between bit line pair and amplifying the voltages of the bit line pair by supplying a power source to the bit line pre-sense amplifier when an active operation is performed; and controlling the power source, supplied to the bit line pre-sense amplifier, to voltage corresponding to voltage precharged in the bit line pair when a precharging operation is performed.

The semiconductor memory device in accordance with an embodiment of the present invention may reduce noise caused by a power source voltage and prevent a leakage current path from being formed by controlling power sources supplied to the bit line pre-sense amplifier and the bit line main sense amplifier in an active operation section and a precharging operation section.

DETAILED DESCRIPTION

Figure 1:
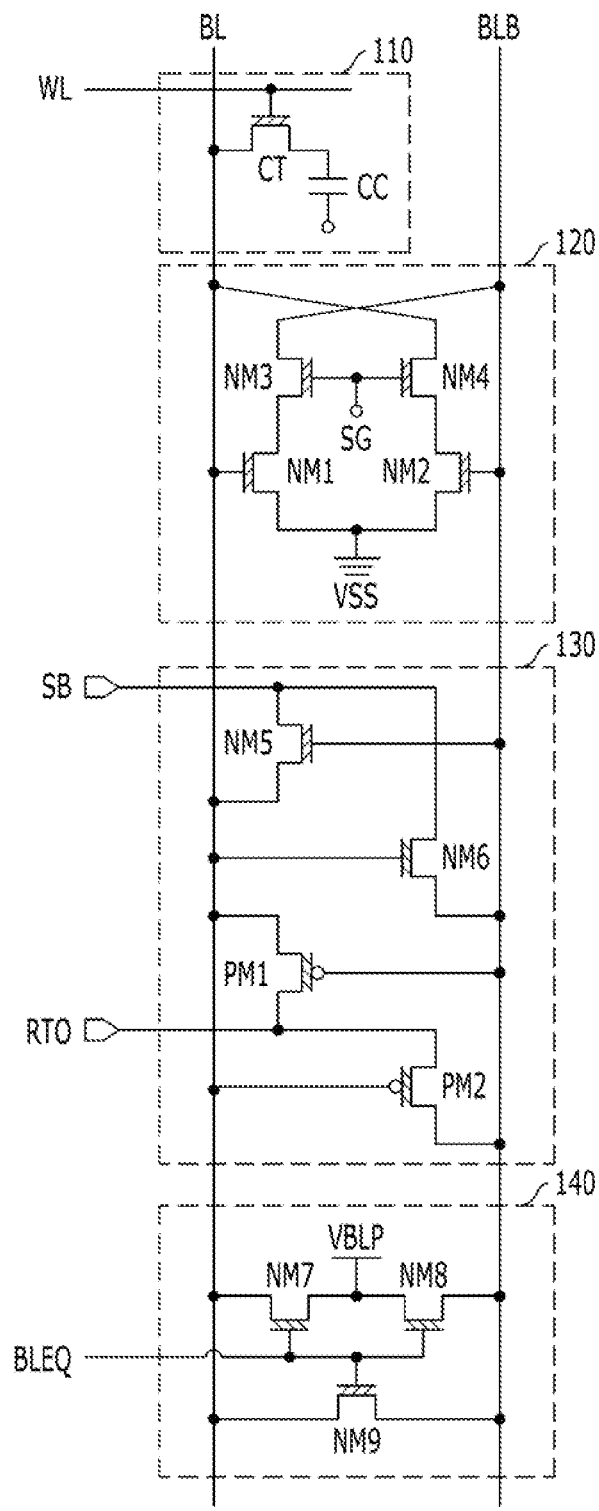
FIG. 1 is a circuit diagram illustrating a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In this specification, a singular form may include a plural form as long as it is not specifically mentioned in a sentence.

Figure 2:
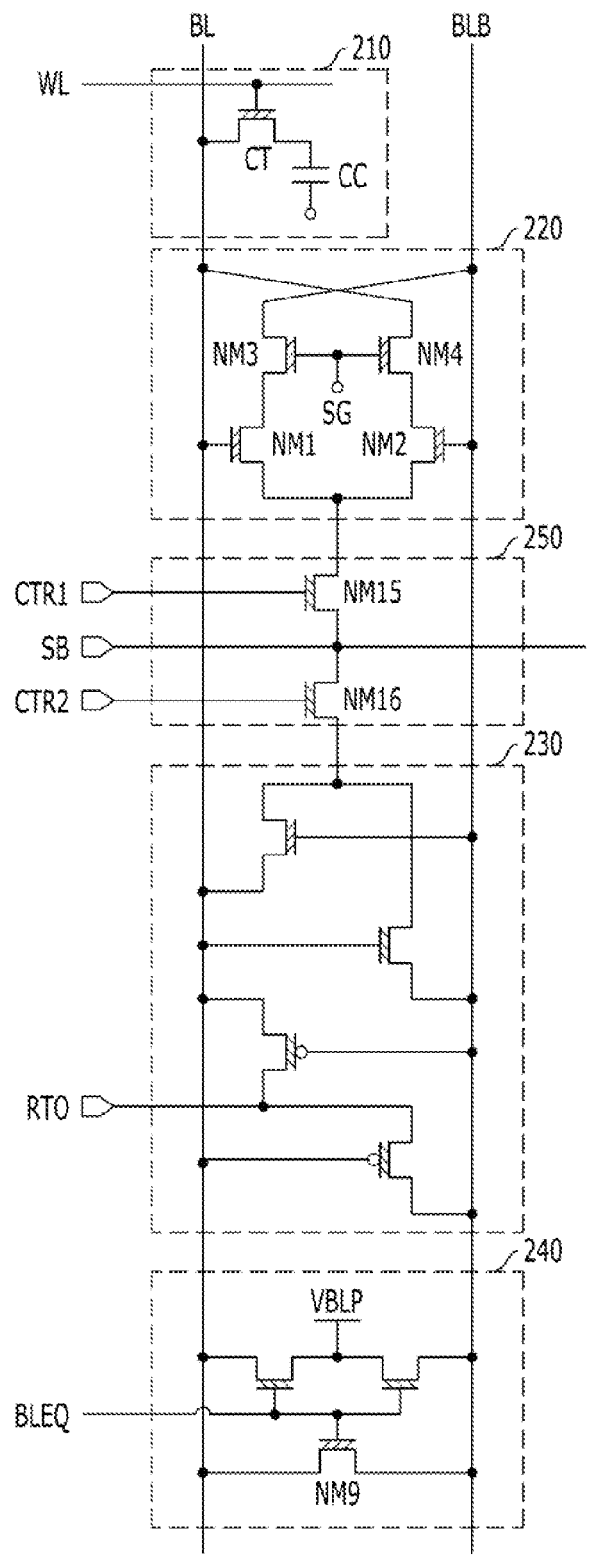
FIG. 2 is a circuit diagram illustrating a semiconductor memory device in accordance with an embodiment of the present invention.

FIG. 2 is a circuit diagram illustrating a semiconductor memory device in accordance with an embodiment of the present invention.

Referring to FIG. 2, the semiconductor memory device includes a memory cell 210, a bit line pre-sense amplifier 220, a bit line main sense amplifier 230, a bit line equalizer 240, and a power supplying controller 250.

The memory cell 210 stores data and includes a cell transistor CT and a cell capacitor CC. The bit line pre-sense amplifier 220 senses a potential difference between bit lines BL and BLB for a specific section in response to an active operation and amplifies the voltages of the bit lines BL and BLB based on the sensed potential difference. The bit line main sense amplifier 230 senses a potential difference between the bit lines BL and BLB and amplifies the voltages of the bit lines BL and BLB to a voltages of a pull-up driving power line RTO and a pull-down driving power line SB based on the sensed potential difference. The bit line equalizer 240 equalizes the voltages of the bit lines BL and BLB to a precharging voltage VBLP in a precharging operation section.

The power supplying controller 250 supplies the voltage of the pull-down driving power line SB to the bit line pre-sense amplifier 220 and the bit line main sense amplifier 230 sequentially. The power supplying controller 250 includes a fifth NMOS transistor NM15, that is, a power source transfer unit for transferring the voltage of the pull-down driving power line SB to the bit line pre-sense amplifier 220 in response to a first transfer control signal CTR1, and sixth NMOS transistor NM16, that is, a power source transfer unit for transferring the voltage of the pull-down driving power line SB to the bit line main sense amplifier 230 in response to a second transfer control signal CTR2. The first and the second transfer control signals CTR1 and CTR2 are activated when an active operation is performed. After the first transfer control signal CTR1 is activated, the second transfer control signal CTR2 is activated. That is, the voltage of the pull-down driving power line SB is supplied to the bit line pre-sense amplifier 220 and then supplied to the bit line main sense amplifier 230.

The semiconductor memory device in accordance with an embodiment of the present invention supplies the voltage of the pull-down driving power line SB to the bit line pre-sense amplifier 220 and the bit line main sense amplifier 230 sequentially when an active operation is performed. Noise due to a ground voltage VSS may be reduced by this operation, as will be described later.

The active operation and the precharging operation of the semiconductor memory device of FIG. 2 are described below.

First, when a word line WL is activated during an active operation, the cell transistor CT is turned on and thus data stored in the cell capacitor CC is transferred to the primary bit line BL. Meanwhile, the power supplying controller 250 supplies the voltage of the pull-down driving power line SB to the bit line pre-sense amplifier 220 in response to the first transfer control signal CTR1. Accordingly, the bit line pre-sense amplifier 220 senses a potential difference between the bit lines BL and BLB for a specific section in which a gate control signal SG is activated, and the bit line pre-sense amplifier 220 amplifies the voltages of the bit lines BL and BLB based on the sensed potential difference. Next, the power supplying controller 250 supplies the voltage of the pull-down driving power line SB to the bit line main sense amplifier 230 in response to the second transfer control signal CTR2. Accordingly, the bit line main sense amplifier 230 senses a potential difference between the bit lines BL and BLB and amplifies the voltages of the bit lines BL and BLB to a core voltage, that is, the voltage of the pull-up driving power line RTO, and the ground voltage VSS, that is, the voltage of the pull-down driving power line SB.

The semiconductor memory device in accordance with an embodiment of the present invention supplies the voltage of the pull-down driving power line SB to the bit line pre-sense amplifier 220 and the bit line main sense amplifier 230 sequentially when an active operation is performed. That is, the bit line pre-sense amplifier 220 primarily senses a potential difference between the bit lines BL and BLB and amplifies the voltages of the bit lines BL and BLB, and the bit line main sense amplifier 230 secondarily senses a potential difference between the bit lines BL and BLB and amplifies the voltages of the bit lines BL and BLB. As can be seen, the ground voltage VSS is separately used according to a different sense amplification operation, and thus noise due to the ground voltage VSS may be minimized.

Next, when a precharging operation is performed, a bit line equalization signal BLEQ becomes a logic low level, and thus the bit lines BL and BLB are driven to the precharging voltage VBLP. As will be described later with reference to FIG. 3, the pull-up driving power line RTO and the pull-down driving power line SB are precharged to the same level as the precharging voltage VBLP when a precharging operation is performed. That is, the voltage of the pull-down driving power line SB supplied to the bit line pre-sense amplifier 220 becomes the precharging voltage VBLP.

The semiconductor memory device in accordance with an embodiment of the present invention drives the pull-down driving power line SB, supplied to the bit line pre-sense amplifier 220, to the same level as the precharging voltage VBLP that is used to precharge the bit lines BL and BLB when a precharging operation is performed. Accordingly, although the gate control signal SG is affected by malfunction when the precharging operation is performed, a current path may not be formed in the first to fourth NMOS transistors NM1, NM2, NM3, and NM4. In other words, when the precharging operation is performed, a leakage current path may not be formed in the bit line pre-sense amplifier 220. This means that unnecessary current consumption may not be generated.

Figure 3:
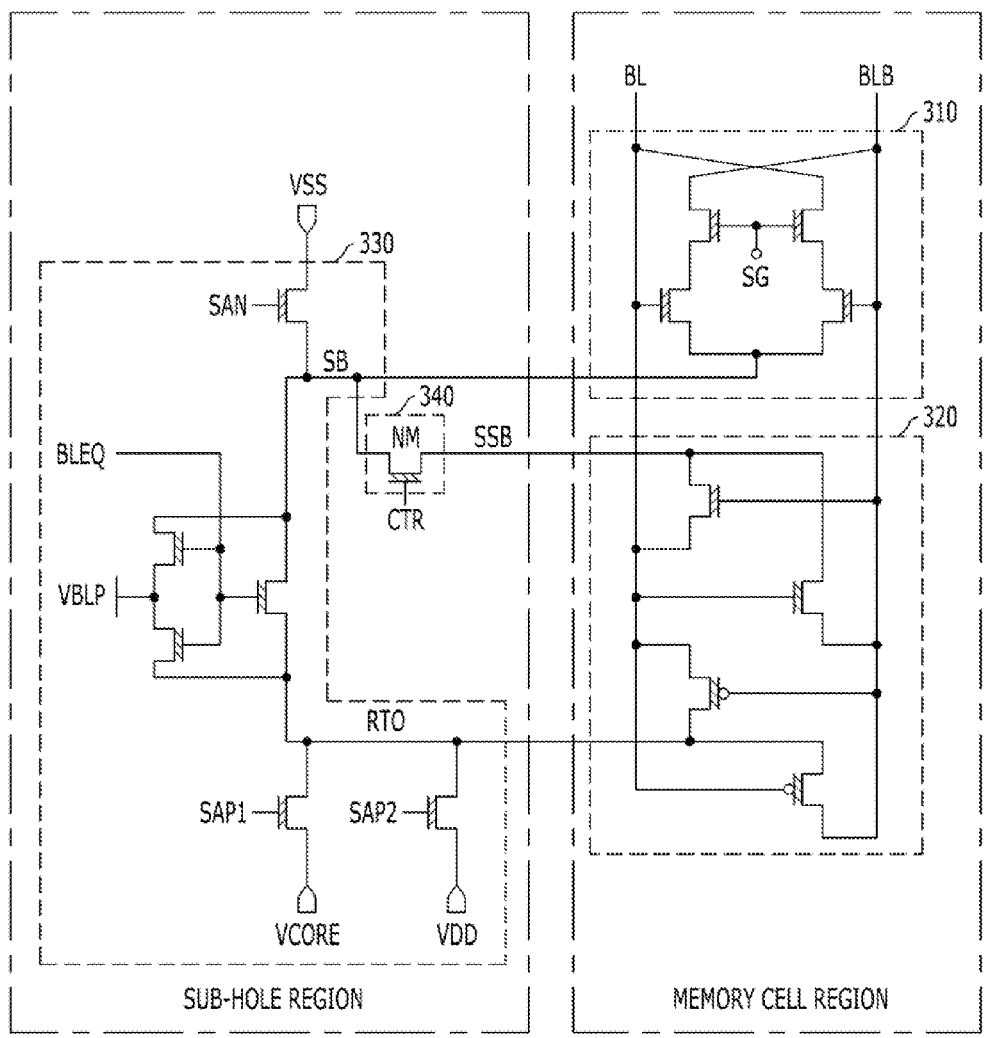
FIG. 3 is a circuit diagram illustrating a semiconductor memory device in accordance with another embodiment of the present invention.

FIG. 3 is a circuit diagram illustrating a semiconductor memory device in accordance with another embodiment of the present invention.

Referring to FIG. 3, the semiconductor memory device includes a bit line pre-sense amplifier 310, a bit line main sense amplifier 320, a power line driving unit 330, and a power supplying controller 340.

The bit line pre-sense amplifier 310 and the bit line main sense amplifier 320 have been fully described, and thus a description thereof is omitted.

The power line driving unit 330 drives a pull-up driving power line RTO in response to first and second pull-up control signals SAP1 and SAP2 and drives a pull-down driving power line SB in response to a pull-down control signal SAN. Furthermore, the power supplying controller 340 supplies a voltage of the pull-down driving power line SB to the bit line pre-sense amplifier 310 and the bit line main sense amplifier 320 sequentially and includes an NMOS transistor NM for transferring the voltage of the pull-down driving power line SB to the bit line main sense amplifier 320 in response to a transfer control signal CTR. The transfer control signal CTR is activated after the pull-down driving power line SB is driven to the ground voltage VSS when the pull-down control signal SAN is activated, and thus the ground voltage VSS is supplied to the bit line pre-sense amplifier 310. That is, the pull-down driving power line SB driven to the ground voltage VSS is first supplied to the bit line pre-sense amplifier 310 and is then supplied to the bit line main sense amplifier 320 in response to he transfer control signal CTR.

Meanwhile, the semiconductor memory device is divided into a memory cell region and a sub-hole region. The memory cell region is a region in which memory cells are disposed (not shown), and bit line pre-sense amplifier 310 and the bit line main sense amplifier 320 are included in the memory cell region. Meanwhile, the sub-hole region is a region in which circuits for controlling a sense amplification operation is disposed, that is, the power line driving unit 330 is included in the sub-hole region. Furthermore, the power supplying controller 340 in accordance with an embodiment of the present invention is included in the sub-hole region.

In general, the density of circuits in the memory cell region is much greater than that in the sub-hole region. Accordingly, in the semiconductor memory device in accordance with an embodiment of the present invention, a load on the arrangement of circuits when the circuits are designed may be reduced because the power supplying controller 340 is disposed in the sub-hole region not in the memory cell region.

Meanwhile, the power supplying controller 340 shown in FIG. 3 includes one NMOS transistor NM. Like in the construction of FIG. 2, the power supplying controller 340 shown in FIG. 3 is configured to supply the pull-down driving power line SB to the bit line pre-sense amplifier 310 and the bit line main sense amplifier 320 sequentially.

Figure 4:
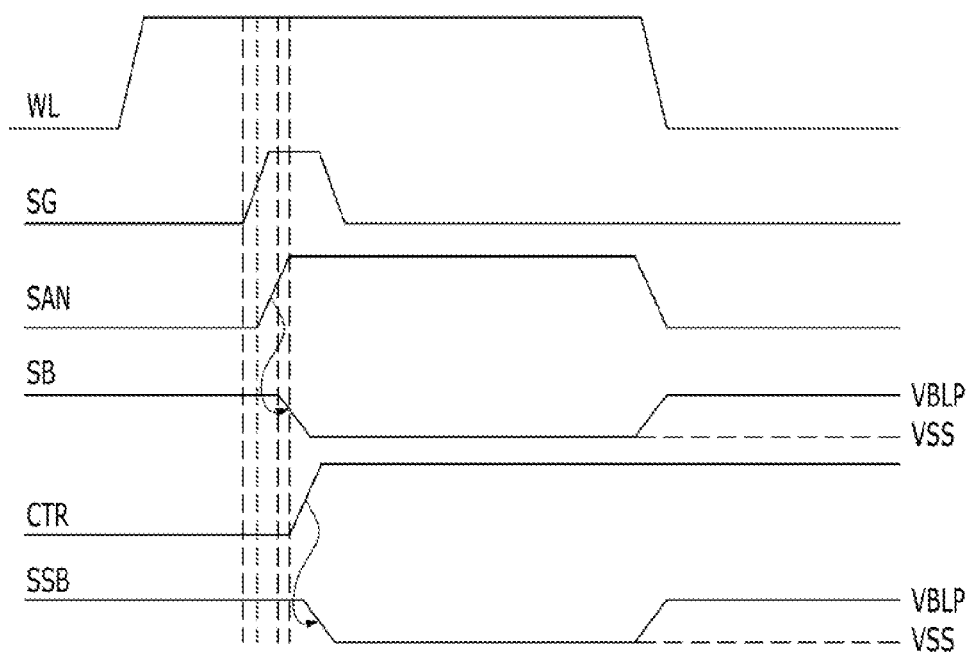
FIG. 4 is a timing diagram illustrating an operation of the semiconductor memory device shown in FIG. 3.

FIG. 4 is a timing diagram illustrating an operation of the semiconductor memory device shown in FIG. 3.

Waveforms of the word line WL, the gate control signal SG, the pull-down control signal SAN, the pull-down driving power line SB, the transfer control signal CTR, and the output signal SSB of the power supplying controller 340 are shown in FIG. 4.

Referring to FIGS. 3 and 4, when an active operation is performed, the pull-down driving power line SB is driven to the ground voltage VSS in response to the pull-down control signal SAN. The voltage of the pull-down driving power line SB is supplied to the bit line pre-sense amplifier 310. After a lapse of a given time, the voltage of the pull-down driving power line SB is supplied to the bit line main sense amplifier 320 in response to the transfer control signal CTR. Here, points of time at which the pull-down control signal SAN and the transfer control signal CTR are activated may be determined by specifications and may be controlled and modified by a designer.

Next, when a precharging operation is performed, the pull-down driving power line SB is driven to the precharging voltage VBLP. The voltage of the pull-down driving power line SB is supplied to the bit line pre-sense amplifier 310.

As described above, the semiconductor memory device in accordance with an embodiment of the present invention may reduce noise caused by the ground voltage VSS by supplying the voltage of the pull-down driving power line SB, driven to the ground voltage VSS, to the bit line pre-sense amplifier 310 and the bit line main sense amplifier 320 sequentially when an active operation is performed and may prevent a leakage current path from being formed by supplying the voltage of the pull-down driving power line SB, driven to the precharging voltage VBLP, to the bit line pre-sense amplifier 310 when a precharging operation is performed.

The present invention is advantageous in that it can guarantee the normal operation of a circuit by reducing noise due to a power source voltage and can reduce unnecessary current consumption by preventing a leakage current path from being formed.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a bit line pre-sense amplifier configured to sense a potential difference between bit line pair and amplify voltages of the bit line pair based on the sensed potential difference;
   a bit line main sense amplifier configured to sense a potential difference between the bit line pair and amplify voltages of the bit line pair to first and second driving voltages based on the sensed potential difference; and
   a power supplying controller configured to supply the second driving voltage to the bit line pre-sense amplifier and the bit line main sense amplifier,
   wherein the first driving voltage is a pull-up driving voltage and the second driving voltage is a pull-down driving voltage.

2. The semiconductor memory device of claim 1, wherein the power supplying controller supplies the second driving voltage to the bit line pre-sense amplifier and then supplies the second driving voltage to the bit line main sense amplifier.

3. The semiconductor memory device of claim 1, further comprising a power line driving unit configured to generate the first and the second driving voltages in response to first and second driving control signals.

4. The semiconductor memory device of claim 3, wherein the power supplying controller comprises:
   a first power source transfer unit for transferring the second driving voltage to the bit line pre-sense amplifier; and
   a second power source transfer unit for transferring the second driving voltage to the bit line main sense amplifier.

5. The semiconductor memory device of claim 4, wherein:
   the first power source transfer unit is enabled in response to the first driving control signal, and
   the second power source transfer unit is enabled after a lapse of a given time.

6. The semiconductor memory device of claim 3, wherein the power supplying controller comprises a power source transfer unit for transferring the second driving voltage to the bit line main sense amplifier.

7. The semiconductor memory device of claim 6, wherein the power source transfer unit is enabled after a lapse of scheduled time later than the first driving control signal.

8. The semiconductor memory device of claim 1, wherein the power supplying controller is disposed in a sub-hole region.

9. The semiconductor memory device of claim 8, wherein:
   the bit line pre-sense amplifier and the main sense amplification unit are disposed in a memory cell region, and
   the memory cell region and the sub-hole region are separated from each other.

10. A semiconductor memory device, comprising:
    a bit line pre-sense amplifier configured to sense a potential difference between bit line pair and amplify voltages of the bit line pair based on the sensed potential difference;
    a bit line main sense amplifier configured to sense a potential difference between the bit line pair and amplify voltages of the bit line pair to first and second driving voltages based on the sensed potential difference;
    a power line driving unit configured to generate the first and the second driving voltages in response to first and second driving control signals; and
    a power source transfer transistor configured to transfer the second driving voltage to the bit line main sense amplifier after the second driving voltage is supplied to the bit line pre-sense amplifier.

11. The semiconductor memory device of claim 10, wherein the power source transfer transistor is enabled after a lapse of given time.

12. A method of operating a semiconductor memory device including a bit line pre-sense amplifier and a bit line main sense amplifier, the method comprising:
    primarily sensing a potential difference between bit line pair and amplifying voltages of the bit line pair by supplying a power source to the bit line pre-sense amplifier when an active operation is performed;
    secondarily sensing a potential difference between the bit line pair and amplifying voltages of the bit line pair by supplying a power source to the bit line main sense amplifier; and
    controlling the power source, supplied to the bit line pre-sense amplifier, to voltage corresponding to voltage precharged in the bit line pair when a precharging operation is performed.

13. The method of claim 12, wherein the power source supplied to the bit line pre-sense amplifier when the precharging operation is performed has a substantially identical level with voltage precharged in the bit line pair.

14. The method of claim 12, wherein the power sources supplied to the bit line pre-sense amplifier and the bit line main sense amplifier have a substantially identical voltage level.

* * * * *